(12) United States Patent
Ochiai

(10) Patent No.: US 9,369,145 B2
(45) Date of Patent: Jun. 14, 2016

(54) ANALOG CONVERSION DEVICE AND PROGRAMMABLE CONTROLLER SYSTEM

(71) Applicant: Shinichiro Ochiai, Nagoya (JP)

(72) Inventor: Shinichiro Ochiai, Nagoya (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/425,106

(22) PCT Filed: Oct. 28, 2012

(86) PCT No.: PCT/JP2012/077786
§ 371 (c)(1),
(2) Date: Mar. 2, 2015

(87) PCT Pub. No.: WO2014/064846
PCT Pub. Date: May 1, 2014

(65) Prior Publication Data
US 2015/0263748 A1    Sep. 17, 2015

(51) Int. Cl.
*G06G 7/00* (2006.01)
*H03M 1/12* (2006.01)
*G06F 3/06* (2006.01)

(52) U.S. Cl.
CPC .............. *H03M 1/12* (2013.01); *G06F 3/0614* (2013.01); *G06F 3/0653* (2013.01); *G06F 3/0683* (2013.01)

(58) Field of Classification Search
None
See application file for complete search history.

(56) References Cited

U.S. PATENT DOCUMENTS

| 4,188,617 | A | 2/1980 | Fauchier et al. |
| 6,381,501 | B1 | 4/2002 | Takase |
| 8,543,744 | B2 | 9/2013 | Onishi et al. |
| 2011/0307635 | A1 | 12/2011 | Onishi et al. |
| 2015/0066227 | A1* | 3/2015 | Chapel ................ H04L 12/4633 700/295 |

FOREIGN PATENT DOCUMENTS

| DE | 2743952 A1 | 4/1978 |
| DE | 112009004529 T5 | 10/2012 |

(Continued)

OTHER PUBLICATIONS

Communication dated Jun. 11, 2015 from the German Patent Office in counterpart application No. 11 2012 006 775.4.

(Continued)

*Primary Examiner* — Tan V. Mai
(74) *Attorney, Agent, or Firm* — Sughrue Mion, PLLC; Richard C. Turner

(57) ABSTRACT

An analog conversion device includes an analog-to-digital (A/D) converter; a shared memory that has an A/D conversion-value storage area for storing the converted digital value and a log storage area for logging a digital value that is stored in the A/D conversion-value storage area and that can be read and accessed from a central processing unit (CPU) that controls an entire programmable controller; a logging execution unit that stores the digital value stored in the A/D conversion-value storage area in the log storage area as logging data; a fixed-number logging detection unit that monitors whether the number of the logging data to be stored in the log storage area has reached a predetermined number since the last interrupt generation request has been made; and an interrupt generation unit that makes an interrupt generation request to the CPU when the number of the logging data has reached the predetermined number.

7 Claims, 4 Drawing Sheets

(56) References Cited

FOREIGN PATENT DOCUMENTS

| | | |
|---|---|---|
| JP | 04-260903 A | 9/1992 |
| JP | 04-288602 A | 10/1992 |
| JP | 05-120086 A | 5/1993 |
| JP | 05-257831 A | 10/1993 |
| JP | 06-282314 A | 10/1994 |
| JP | 08-069355 A | 3/1996 |
| JP | 2000-235412 A | 8/2000 |
| JP | 2005-164500 A | 6/2005 |
| JP | 2007-233593 A | 9/2007 |
| JP | 2008-020392 A | 1/2008 |
| WO | 2010/109584 A1 | 9/2010 |

OTHER PUBLICATIONS

International Search Report for PCT/JP2012/077786 dated Jan. 22, 2013.

Office Communication, dated Mar. 30, 2016, issued in corresponding German Patent Application No. 11 2012 006 775.4.

* cited by examiner (a)

| LOGGING READOUT NUMBER | 1,000 |
|---|---|
| CURRENT LOGGING READOUT POINTER | 1 |
| PREVIOUS LOGGING READOUT POINTER | -1 |

(b)

| LOGGING READOUT NUMBER | 1,000 |
|---|---|
| CURRENT LOGGING READOUT POINTER | 1,001 |
| PREVIOUS LOGGING READOUT POINTER | 1 |

ANALOG CONVERSION DEVICE AND PROGRAMMABLE CONTROLLER SYSTEM

CROSS REFERENCE TO RELATED APPLICATIONS

This application is a National Stage of International Application No. PCT/JP2012/077786 filed Oct. 26, 2012, the contents of all of which are incorporated herein by reference in their entirety.

FIELD

The present invention relates to an analog conversion device attached to a programmable controller (hereinafter, "PLC" (programmable logic controller)) and a PLC system.

BACKGROUND

When an analog data value is input to a PLC, an A/D conversion unit (an A/D conversion device) is used to convert the analog data value to a digital value. Generally, the A/D conversion sampling cycle of the A/D conversion unit that converts an input analog data value to a digital value is asynchronous with a control cycle (a scan time) of a CPU (Central Processing Unit) unit that controls the entire PLC system; and, in many cases, the sampling cycle is faster than the control cycle. Therefore, when A/D conversion values are logged, it is difficult to log all the A/D conversion values by the CPU unit without missing some of them.

There is a method of performing a logging process in the A/D conversion unit that logs all the A/D conversion values without missing any part thereof. However, in order to refer to the collected data, the relevant data needs to be read out into the CPU unit after the logging has been completed. Conventionally, a dedicated communication process needs to be performed many times during the reading process, and thus there is a problem in that the process takes a long time.

In order to solve this problem, a technique, which does not requiring dedicated processing and in which A/D conversion values are stored in a shared memory that is an area accessible from a CPU unit all the time, has been proposed (see, for example, Patent Literature 1). Furthermore, a continuous data collection method that uses a technique for collecting data in a ring buffer format has been provided (see, for example, Patent Literature 2). Further, a technique for collecting data in a shared memory on a ring buffer format has been also proposed (see, for example, Patent Literature 3).

Furthermore, a technique for collecting and referring to continuous data; a technique for handling collected data in chronological order; and a technique for logging A/D conversion values that are updated in a faster A/D conversion cycle (a sampling cycle) have been proposed (see, for example, Patent Literature 4). Specifically, acquisition of continuous logging data is made possible by a CPU unit that monitors a specific shared memory and extracts logging data stored in a finite internal memory of an A/D conversion unit on a ring buffer configuration into an internal register of the CPU unit before the logging data is overwritten.

CITATION LIST

Patent Literatures

Patent Literature 1: Japanese Patent Application Laid-open No. H8-69355

Patent Literature 2: Japanese Patent Application Laid-open No. 2008-20392

Patent Literature 3: Japanese Patent Application Laid-open No. 2007-233593

Patent Literature 4: International Publication No. WO2010/109584

SUMMARY

Technical Problem

According to the technique described in Patent Literature 1, previous data is overwritten whenever data is stored, and thus it has been difficult to collect and refer to the continuous data. According to the technique described in Patent Literature 2, the latest and the oldest data cannot be identified in a memory area having a ring buffer configuration, and it has been difficult to handle the collected data in chronological order. Further, the technique described in Patent Literature 3 is for the purpose of realizing logging synchronously with a control cycle of a CPU unit, and it has been difficult to log A/D conversion values which are updated in a faster A/D conversion sampling cycle.

According to the technique described in Patent Literature 4, a logging process is performed by the A/D conversion unit, and the CPU unit performs monitoring and executes reading control of logging data. Therefore, a time loss occurs, and it has been difficult to acquire continuous logging data in a faster logging cycle (an A/D conversion cycle).

The present invention has been achieved in view of the above problems, and an objective of the present invention is to provide an analog conversion device and a programmable controller system that can eliminate time loss in acquiring continuous logging data during a faster logging cycle (an A/D conversion cycle).

Solution to Problem

To achieve the objective, the present invention relates to an analog conversion device that is attached to a programmable controller to convert an analog value input from outside to a digital value sequentially. The analog conversion device includes: an A/D converter that converts an analog value input from outside to a digital value; a first memory unit that has an A/D conversion-value storage area for storing the converted digital value and a log storage area for logging the digital value stored in the A/D conversion-value storage area, and can be read and accessed from a CPU unit that controls the entire programmable controller; a logging execution unit that stores the digital value stored in the A/D conversion-value storage area in the log storage area as logging data; a fixed-number logging detection unit that monitors whether number of the logging data to be stored in the log storage area has reached a predetermined number since the last time an interrupt generation request has been made 1; and an interrupt generation unit that makes an interrupt generation request to the CPU unit when the number of the logging data has reached the predetermined number.

Advantageous Effects of Invention

According to the present invention, a logging detection unit monitors the number of logging data stored in a first memory unit, and when the number of the logging data has reached a predetermined number, an interrupt generation unit makes an interrupt generation request to a CPU unit. Accordingly, the time loss can be eliminated in acquiring continuous logging data on a faster logging cycle (an A/D conversion cycle).

DESCRIPTION OF EMBODIMENTS

Exemplary embodiments of an analog conversion device and a programmable controller system according to the present invention will be described below in detail with reference to the accompanying drawings. The present invention is not limited to the embodiments.

Figure 1:
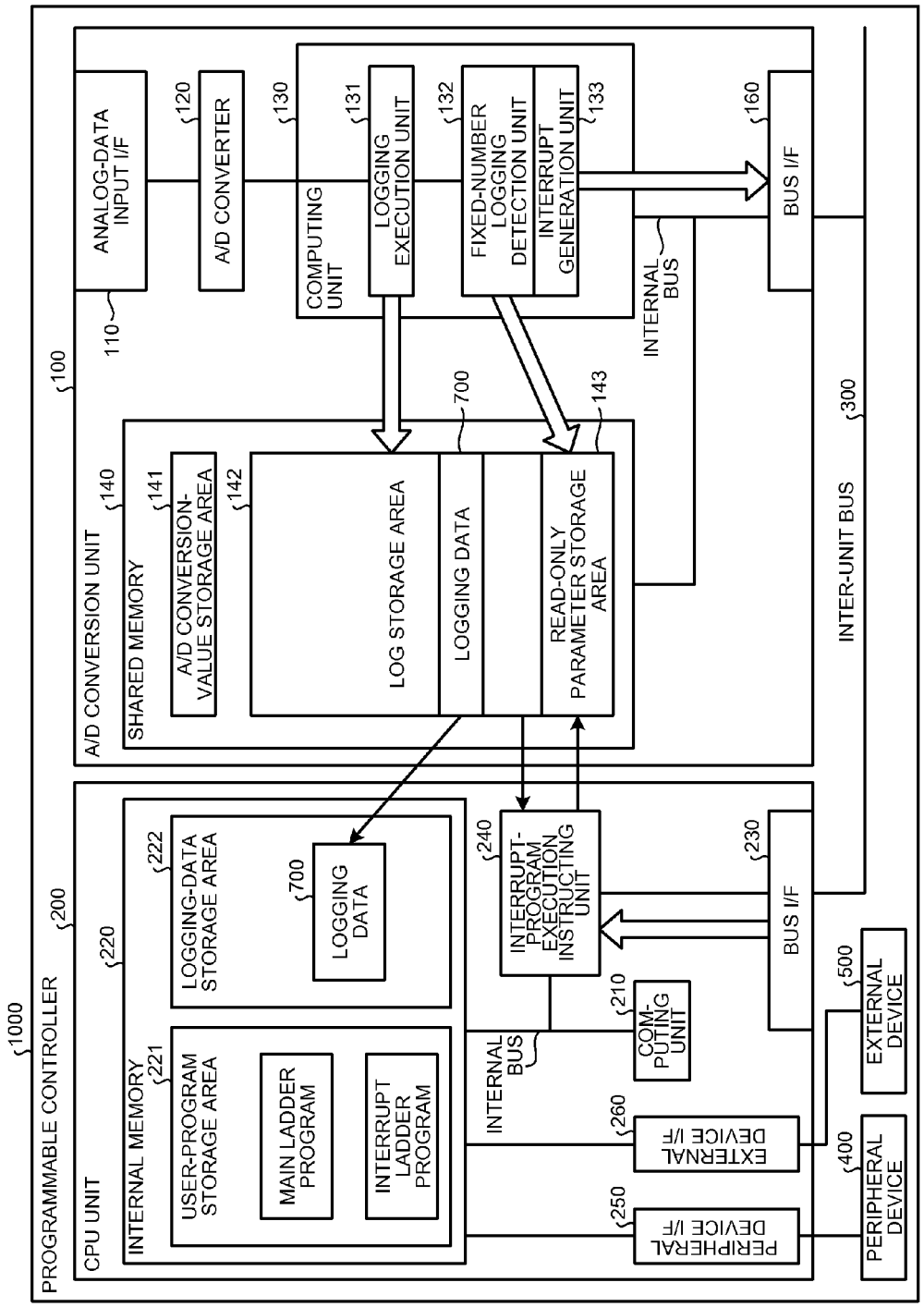
FIG. 1 is a block diagram schematically illustrating a configuration of a PLC system including an A/D conversion device (an analog unit).

FIG. 1 is a block diagram schematically illustrating a configuration of a PLC system including an A/D conversion device (an analog unit). An A/D conversion unit 100 is connected to a CPU unit 200 via an inter-unit bus 300, and the A/D conversion unit 100 and the CPU unit 200 constitute a part of a PLC (programmable controller) 1000. In addition to the A/D conversion unit 100 and the CPU unit 200, and in accordance with the purpose, the following are attached to the PLC 1000 via the inter-unit bus 300: a motion controller unit that controls a servo amplifier and the like to execute multi-axial position control; a temperature controller unit that outputs a temperature control signal for performing heating and cooling so as to make the temperature reach the temperature desired by the CPU unit 200; and the like. However, units other than the A/D conversion unit 100 and the CPU unit 200 are not described here.

The A/D conversion unit 100 includes an analog-data input interface (I/F) 110 that receives an input of an analog data value; an A/D converter 120 that converts the received analog data value to a digital value (an A/D conversion value); a calculation unit 130 that executes control of the entire A/D conversion unit 100; a shared memory 140 that stores the A/D converted digital value as logging data and the data value thereof is shared with the CPU unit 200; and a bus I/F 160 that is a communication interface for performing communication with the CPU unit 200 via the inter-unit bus 300. The calculation unit 130, the shared memory 140, and the bus I/F 160 are connected to each other by an internal bus.

An A/D conversion-value storage area 141 is an area in which an A/D conversion value read by a cyclic process performed by the CPU unit 200 is recorded, and it is set aside in the shared memory 140. As described above, an interval (a sampling interval) for sampling the analog data value to convert the value to a digital value is generally faster than the cycle of the cyclic process. Therefore, it is difficult for the CPU unit 200 to read and log the A/D conversion values written in the A/D conversion-value storage area 141 without missing any of the A/D conversion values. A log storage area 142, which is a recording area for recording the A/D conversion values as logging data 700, is set aside in the shared memory 140 to which the A/D conversion unit 100 can write data at a high speed and to which the CPU unit 200 can perform reading and accessing without performing any complicated communication process other than the A/D conversion-value storage area 141 described above. Note that the logging data 700 recorded in the log storage area 142 is read out by a peripheral device 400 via the inter-unit bus 300 and the CPU unit 200.

The log storage area 142 has a ring buffer configuration. That is, the logging data 700 is written into the log storage area 142 in chronological order from the first address. When the write address of the logging data 700 has reached the last address, the process wraps around so as to overwrite the logging data 700 from the first address.

Figure 2:
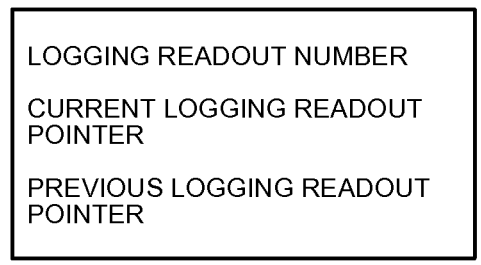
FIG. 2 illustrates an example of read-only parameters.

A read-only parameter storage area 143 for storing read-only parameters for reading the logging data 700 at the generation of an interrupt, described later, is set aside in the shared memory 140. FIG. 2 illustrates an example of the read-only parameters. The read-only parameters include the logging readout number, which is the number of the logging data 700 to be read, a current logging readout pointer indicating a readout source address of the logging data 700, and a previous logging readout pointer indicating a reading start position of the logging data 700 at the time of the previous interrupt. An interrupt ladder program executed by the CPU unit 200 can be simplified and the execution speed can be increased on the basis of the read-only parameters.

The calculation unit 130 includes a logging execution unit 131, a fixed-number logging detection unit 132, and an interrupt generation unit 133. The logging execution unit 131 sequentially writes the A/D converted digital value output from the A/D convertor 120 in the log storage area 142 of the shared memory 140 as the logging data. The log storage area 142 has a ring buffer configuration.

The fixed-number logging detection unit 132 monitors whether storage of the logging data 700 for the logging readout number set by the read-only parameters has been completed since the last time the interrupt process was performed. When detecting that pieces of logging data 700 for the number of the logging readout number have been stored in the log storage area 142, the fixed-number logging detection unit 132 acquires the start position of the logging data 700 to be read by the CPU unit 200 this time as the current logging readout pointer of the read-only parameters, and it also acquires a value stored in the current logging readout pointer of the read-only parameters at present (before being rewritten) as the previous logging readout pointer. The fixed-number logging detection unit 132 writes the acquired current logging readout pointer and the previous logging readout pointer in the read-only parameter storage area 143.

The interrupt generation unit 133 causes the CPU unit 200 to generate an interrupt when the fixed-number logging detection unit 132 has detected that a predetermined number of pieces of logging data 700 are being stored. Specifically, when the fixed-number logging detection unit 132 stores (writes) the read-only parameters in the read-only parameter storage area 143 of the shared memory 140, the interrupt generation unit 133 transmits an interrupt generation request to the CPU unit 200.

In this manner, according to the present embodiment, a process of monitoring is performed on the A/D conversion unit 100 if a predetermined number of pieces of logging data 700 has been stored in the log storage area 142 since the last time the logging data was read.

The CPU unit 200 includes a calculation unit 210 that executes a user program and control of the entire CPU unit 200; an internal memory 220 for storing data required for execution of the user program and input/output values of the user program; a bus I/F 230 that is a communication interface for performing communication with the A/D conversion unit 100 via the inter-unit bus 300; an interrupt-program execution instructing unit 240 that monitors the presence of an interrupt from the A/D conversion unit 100 and instructs the calculation unit 210 to execute an interrupt program upon detection of the interrupt; and a peripheral device I/F 250 and an external device I/F 260, the former being an interface for connecting to the peripheral device 400 such as a personal computer that sets the user program and displays a state of data in the internal memory 220, and the latter being an external device 500 such as a display unit. A system including the PLC 1000 and the peripheral device 400 connected to the PLC 1000 is referred to as "PLC system".

The internal memory 220 is provided with a user-program storage area 221 for storing the user program such as a main ladder program that is the main program executed by the calculation unit 210 and an interrupt ladder program executed at the generation of an interrupt. The internal memory 220 is also provided with a logging-data storage area 222 for storing the logging data 700 acquired from the A/D conversion unit 100 by the interrupt ladder program.

Operations of the PLC and the PLC system are described next. The CPU unit 200 repeats execution of the user program, which is a program for controlling industrial devices by operating various units with which the PLC 1000 is provided, repeats output of an execution result, and repeats acquisition of an input value such as a value used by the user program in a predetermined cycle. This repetitive operation is referred to as "cyclic process". The CPU unit 200 reads a digital value (an A/D conversion value) of an observation value from the shared memory 140 as part of an acquisition operation of the input value included in the cyclic process.

Meanwhile, the A/D conversion unit 100 receives inputs of analog data values from a sensor that outputs various observation values relating to the industrial device and the like to be controlled by the PLC 1000 as current values or voltage values by observing, for example, flow rates, pressures, temperatures, and the like, and converts the inputs of the received analog data values to digital values, and writes the digital values (A/D conversion values) in the shared memory 140 provided therein.

When A/D conversion performed by the A/D convertor 120 is started, the logging execution unit 131 starts logging the A/D conversion values. The logging execution unit 131 stores the A/D conversion value output from the A/D convertor 120 in the first address of the log storage area 142 for each logging cycle. When pieces of logging data are sequentially stored and the A/D conversion value is stored in the last address of the log storage area 142, as described above, the process performs a wrap around and overwrites the logging data 700 from the first address again. Such a logging process is well known and therefore detailed explanations thereof will be omitted.

Figure 3:
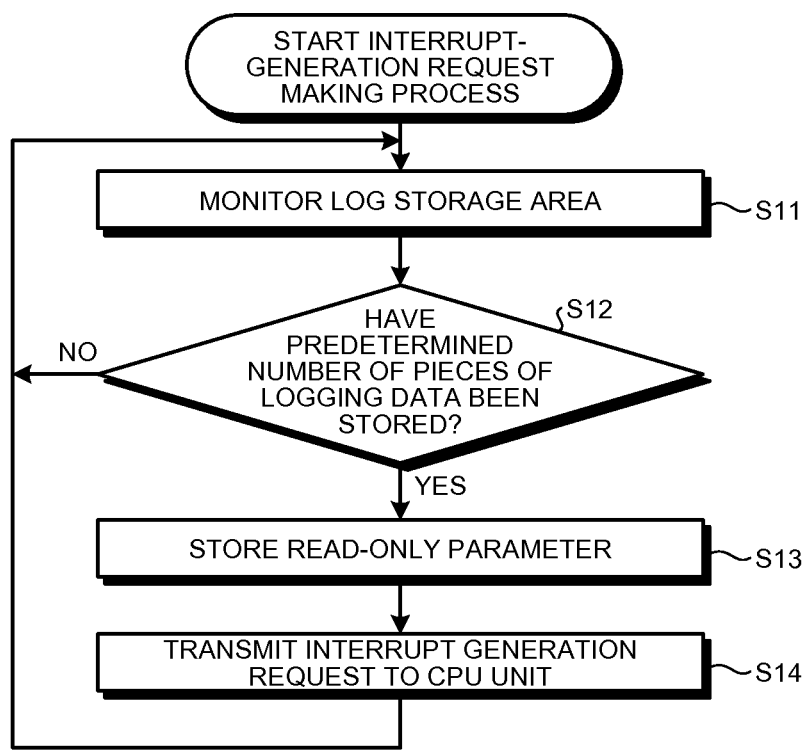
FIG. 3 is a flowchart illustrating an example of a procedure of an interrupt-generation request-making process performed by an A/D conversion unit.

A specific process in which the logging data is read by the CPU unit 200 according to the present embodiment is described below. FIG. 3 is a flowchart illustrating an example of a procedure of an interrupt-generation request-making process performed by the A/D conversion unit.

First, the fixed-number logging detection unit 132 of the calculation unit 130 in the A/D conversion unit 100 monitors the log storage area 142 of the shared memory 140 (Step S11) so as to determine whether a predetermined number of pieces of logging data 700 have been stored in the log storage area 142 (Step S12). Specifically, the fixed-number logging detection unit 132 monitors whether the pieces of logging data 700 that have been stored are the number specified by the logging readout number of the read-only parameter since the last time an interrupt was generated. The number of pieces of logging data 700 to be stored since the last time an interrupt was generated is acquired, for example, by measuring the number of pieces of logging data 700 to be stored by using a position away, by the logging readout number, from a position specified by the current logging readout pointer of the read-only parameters as a read start position.

If the predetermined number of pieces of logging data 700 have not been stored in the log storage area 142 (NO at Step S12), the process returns to Step S11. If the predetermined number of pieces of logging data 700 have been stored in the log storage area 142 (YES at Step S12), the fixed-number logging detection unit 132 designates the current logging readout pointer stored in the read-only parameter storage area 143 of the shared memory 140 at present as a new previous logging readout pointer and the read start position as the current logging readout pointer so as to generate new read-only parameters, and it then stores (writes) the new read-only parameters in the read-only parameter storage area 143 (Step S13).

Thereafter, the interrupt generation unit 133 transmits an interrupt generation request to the CPU unit 200 (Step S14), and the process returns to Step S11. The interrupt generation request is transmitted to the interrupt-program execution instructing unit 240 via the internal bus of the A/D conversion unit 100, the bus I/F 160, the inter-unit bus 300, the bus I/F 230 of the CPU unit 200, and the internal bus.

A specific example is described here. It is assumed that up to 10000 pieces of the logging data can be stored in the log storage area 142, and when 1000 pieces of logging data 700 are collected, the interrupt generation unit 133 generates an interrupt. In the example, it is assumed that each piece of logging data 700 is stored in an area having a predetermined size, and identifiers (for example, addresses) 1 to 10000 are allocated sequentially from the area in which the logging data 700 is stored first.

Figures 4, 5:
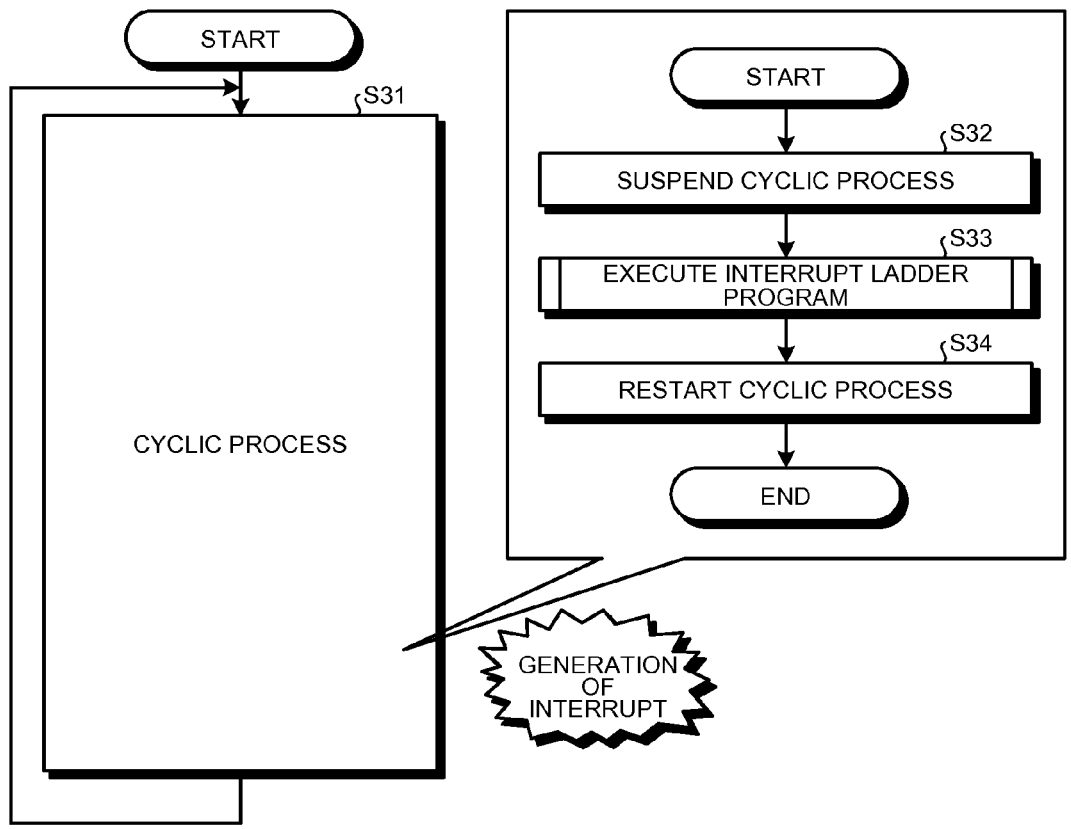
FIG. 4 illustrates an example of the read-only parameters.
FIG. 5 is a flowchart illustrating an example of a procedure of a cyclic process when an interrupt is performed by the CPU unit.

FIG. 4 illustrates an example of the read-only parameters. FIG. 4(a) illustrates an example of the read-only parameters in an initial state where the logging data 700 has not been stored in the log storage area 142. "1000" is set as the logging readout number, "1" indicating the storage position of the first logging data is set as the current logging readout pointer, and the invalid numeral (in this example, "−1") is set as the previous logging readout pointer.

FIG. 4(b) illustrates an example of the read-only parameters in a state where 1000 pieces of logging data 700 have been stored, and FIG. 4(b) also illustrates an example of a state immediately after performing the process at Step S13 described above. The current logging readout pointer in FIG. 4(a) is set as the previous logging readout pointer in FIG. 4(b). "1001" is a value obtained by adding the logging readout number to the previous logging readout pointer and is set as the current logging readout pointer.

Figure 6:
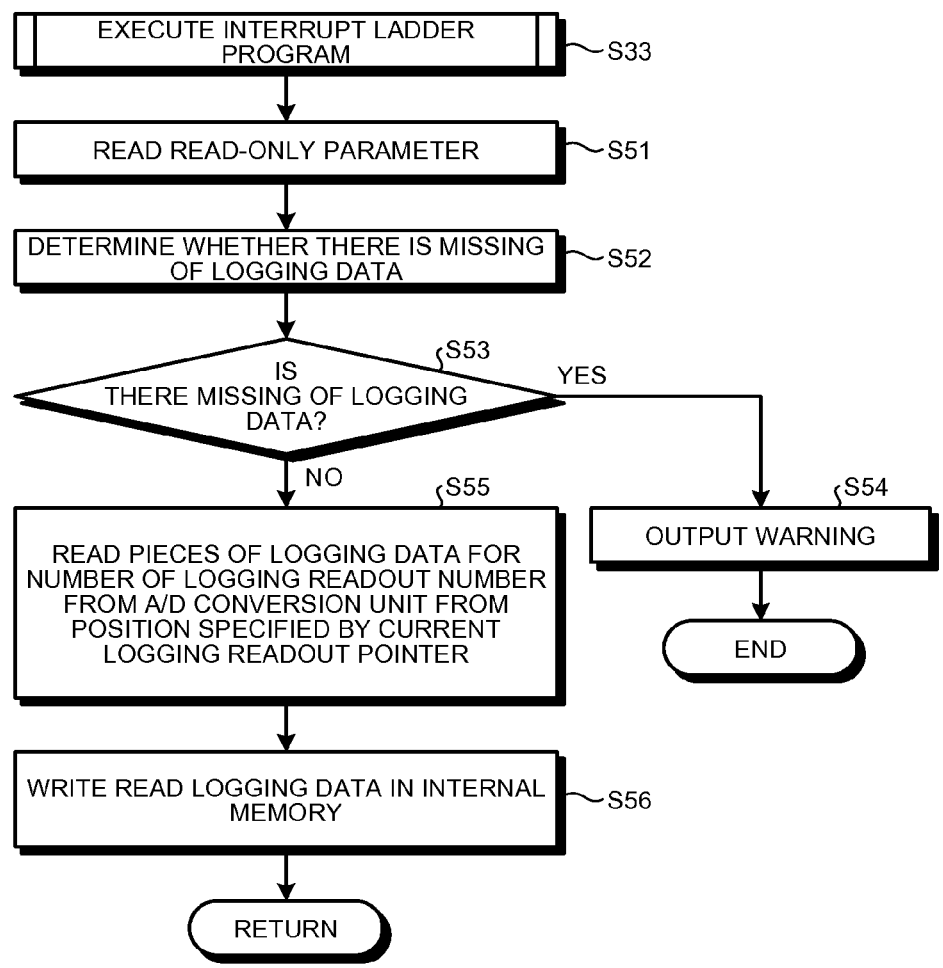
FIG. 6 is a flowchart illustrating an example of a procedure of the cyclic process when an interrupt is performed by the CPU unit.
Figure 7:
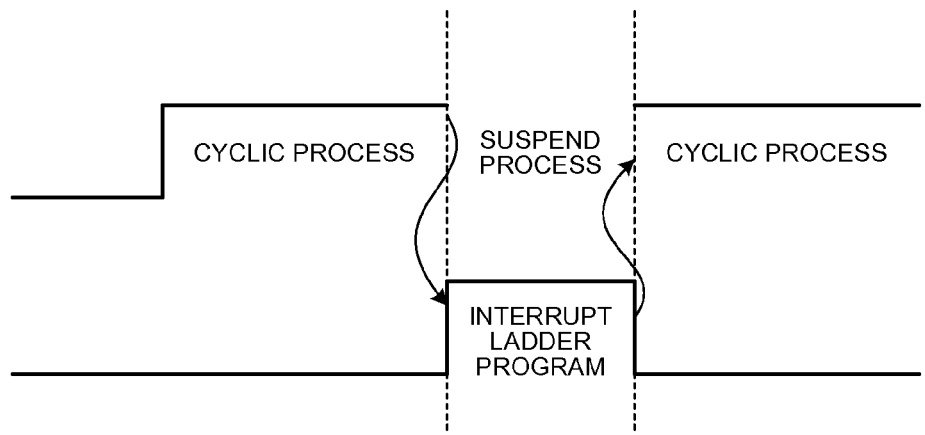
FIG. 7 schematically illustrates a process sequence of an interrupt process.

FIGS. 5 and 6 are flowcharts illustrating examples of a procedure of the cyclic process at the generation of an interrupt performed by the CPU unit. FIG. 7 schematically illustrates a process sequence at an interrupt process. The calculation unit 210 of the CPU unit 200 performs the cyclic process (Step S31).

The interrupt-program execution instructing unit 240 monitors whether an interrupt generation request has been received from the A/D conversion unit 100 during the cyclic process. If any interrupt generation request has not been received, the cyclic process is repetitively performed. If an interrupt generation request has been received, the interrupt-program execution instructing unit 240 instructs the calculation unit 210 to execute the interrupt ladder program. Upon reception of the execution instruction of the interrupt ladder program, the calculation unit 210 suspends the cyclic process being performed (Step S32), and executes the interrupt ladder program (Step S33).

An example of a process of the interrupt ladder program is described here with reference to FIG. 6. FIG. 6 illustrates a part of the process of the interrupt ladder program. When the interrupt ladder program is executed, the calculation unit 210 reads the read-only parameters from the read-only parameter storage area 143 in the shared memory 140 of the A/D conversion unit 100 (Step S51).

The calculation unit 210 then determines whether all the pieces of logging data 700 have been read without missing any part of logging data 700 by using the read-only parameters (Step S52). When the interrupt ladder program is used, an activate request from the interrupt ladder program cannot be received because the activation timing interval is short and also because a part of the logging data 700 may be missing. In the example, therefore, it is determined whether part of the logging data 700 is missing.

Specifically, the calculation unit 210 compares the read position of the previous logging data 700 held in the CPU unit 200 with the previous logging readout pointer in the read-only parameters read at Step S52, thereby determining whether the read position and the previous logging readout pointer match each other. If the read position and the previous logging readout pointer match each other, it indicates that upon reception of the interrupt generation request, the interrupt ladder program has been activated to perform a reading process of the logging data 700 from the A/D conversion unit 100, i.e., there is part of the logging data 700 missing. On the other hand, if the read position and the previous logging readout pointer do not match each other, it indicates that, upon reception of the interrupt generation request, the interrupt ladder program was not activated due to some reason and the logging data 700 has not been able to be read from the A/D conversion unit 100, i.e., there is a part of the logging data 700 missing.

If part of the logging data 700 is missing (YES at Step S53), the calculation unit 210 assumes that there is a certain abnormality in the PLC 1000 (the PLC system) and outputs a warning (Step S54), and then the process is finished. The warning is output to the external device 500 such as a display unit via the external device I/F 260.

If none of the logging data 700 is missing (NO at Step S53), the calculation unit 210 reads the pieces of logging data 700 for the number specified by the logging readout number from the log storage area 142 in the shared memory 140 of the A/D conversion unit 100. The reading is done from the position specified by the current logging readout pointer in the read-only parameters (Step S55). The calculation unit 210 writes (stores) the read logging data 700 in the logging-data storage area 222 in the internal memory 220 of the CPU unit 200 (Step S56). The process of the interrupt ladder program finishes here, and then returns to FIG. 5.

Thereafter, the calculation unit 210 restarts the suspended cyclic process (Step S34). As illustrated in FIG. 7, as the sequence of the interrupt process, when an interrupt is generated while the cyclic process is being performed, the cyclic process is suspended, and the interrupt ladder program is executed. When the process of the interrupt ladder program finishes, the cyclic process is performed again from the suspended position.

In the above explanations, the previous logging readout pointer is provided in the read-only parameters so that the missing logging data 700 can be monitored. However, if the missing logging data 700 is not to be monitored, the previous logging readout pointer can be omitted.

The pieces of logging data 700 accumulated in the internal memory 220 of the CPU unit 200 can be stored in a recording medium such as an external memory via the external device I/F 260.

Conventionally, when continuous pieces of logging data 700 are acquired from the A/D conversion unit 100, before the data logged in the log storage area 142 in a ring buffer format is overwritten by the logging execution unit 131, the data needs to be read out into the internal memory 220 of the CPU unit 200. Therefore, according to conventional techniques, the CPU unit 200 monitors the log storage area 142 and reads the logging data 700 to be stored in the log storage area 142 into the internal memory 220 before the logging data 700 is overwritten according to the user program (a program for storing the logging data 700 in the A/D conversion unit 100 in the internal memory 220 of the CPU unit 200).

Meanwhile, according to the present embodiment, the A/D conversion unit 100 includes: the fixed-number logging detection unit 132, which monitors, on the A/D conversion unit 100, whether a predetermined number of pieces of logging data 700 to be stored in the log storage area 142 in a ring buffer configuration have been stored; and the interrupt generation unit 133 that transmits an interrupt generation request to the CPU unit 200 when the predetermined number of pieces of logging data 700 have been stored. Further, the interrupt-program execution instructing unit 240 that outputs an interrupt request for causing the calculation unit 210 to execute the interrupt ladder program to the calculation unit 210, upon reception of the interrupt generation request from the A/D conversion unit 100, is provided in the CPU unit 200. Accordingly, a regular monitoring process from the CPU unit 200 to the A/D conversion unit 100 becomes unnecessary, and thus a sequence scan time can be shortened.

Furthermore, when the CPU unit 200 reads the logging data 700, the interrupt ladder program created by a user is simplified by using read-only parameters including the read start position and the number of readings of the logging data 700, and thus the sequence scan time can be shortened.

Further, in the PLC system using the CPU unit 200 and the A/D conversion unit 100 as described above, acquisition of continuous logging data can be realized with a faster logging cycle (an A/D conversion cycle) than a conventional logging cycle.

INDUSTRIAL APPLICABILITY

As described above, the A/D conversion unit and the PLC system are preferably applicable to an A/D conversion unit attached to a PLC and a PLC system.

REFERENCE SIGNS LIST

100 A/D conversion unit, 110 analog-data input I/F, 120 A/D converter, 130 calculation unit, 131 logging execution unit, 132 fixed-number logging detection unit, 133 interrupt generation unit, 140 shared memory, 141 A/D conversion-value storage area, 142 log storage area, 143 read-only parameter storage area, 160, 230 bus I/F, 200 CPU unit, 210 calculation unit, 220 internal memory, 221 user-program storage area, 222 logging-data storage area, 240 interrupt-program execution instructing unit, 250 peripheral device I/F, 260 external device I/F, 300 inter-unit bus, 400 peripheral device, 500 external device, 700 logging data.

The invention claimed is:

1. An analog conversion device that is attached to a programmable controller and is connected to a central processing unit (CPU) via an inter-unit bus to convert an analog value input from outside to a digital value sequentially and to output the digital value to the CPU, the analog conversion device comprising:

an analog-to-digital (A/D) converter that converts an analog value input from outside to a digital value;

a first memory unit that has an A/D conversion-value storage area for storing the converted digital value, a log storage area having a ring buffer configuration for logging the digital value stored in the A/D conversion-value storage area, and a read-only parameter storage area for storing read-only parameters including a current logging readout pointer indicating a storage position of logging data to be read next, and logging readout number, the logging readout number being a number of the logging data to be read and is read and accessed from the CPU that controls the entire programmable controller;

a logging execution unit that stores the digital value stored in the A/D conversion-value storage area in the log storage area as logging data;

a fixed-number logging detection unit that stores the current logging readout pointer and a previous logging readout pointer indicating a read start position of the logging data at the time of a previous interrupt in the read-only parameter storage area in response to the number of the logging data to be stored in the log storage area reaching the logging readout number since the last interrupt generation request has been made to the CPU; and an interrupt generation unit that instructs the CPU to perform a process of making an interrupt generation request when the number of the logging data has reached the logging readout number so that the CPU performs a reading process of the logging data by suspending a cyclic process being performed by the CPU.

2. The analog conversion device according to claim 1, wherein the fixed-number logging detection unit monitors whether the number of the logging data to be stored in the log since the last time an interrupt generation request was made, and when the number of the logging data has reached the logging readout number, writes, as a new one of the current logging readout pointer in the read-only parameter storage area, a storage position acquired by adding the logging readout number to the current logging readout pointer stored in the read-only parameter storage area.

3. A programmable controller system in which an analog conversion device that converts an analog value input from outside to a digital value sequentially is connected with a central processing unit (CPU) via an inter-unit bus, wherein the analog conversion device includes an analog-to-digital (A/D) converter that converts an analog value input from outside to a digital value, a first memory unit that has an A/D conversion-value storage area for storing the converted digital value, a log storage area having a ring buffer configuration for logging the digital value stored in the A/D conversion-value storage area, and a read-only parameter storage area for storing read-only parameters including a current logging readout pointer indicating a storage position of logging data to be read next, a logging readout number, which is number of the logging data to be read and is read and accessed from the CPU, a logging execution unit that stores the digital value stored in the A/D conversion-value storage area in the log storage area as logging data, a fixed-number logging detection unit that stores the current logging readout pointer and a previous logging readout pointer indicating a read start position of the logging data at the time of a previous interrupt in the read-only parameter storage area in response to the number of the logging data to be stored in the log storage area reaching the logging readout number since the last time an interrupt generation request was made to the CPU, and an interrupt generation unit that instructs the CPU to perform a process of making an interrupt generation request when the number of the logging data has reached the logging readout number, so that the CPU performs a reading process of the logging data by suspending a cyclic process being performed by the CPU, and the CPU includes an interrupt-program execution instructing unit that instructs a calculation unit to execute an interrupt program for executing read of the logging data from the analog conversion device, upon reception of the interrupt generation request from the analog conversion device, a calculation unit that performs the cyclic process according to a user program and, upon reception of an execution instruction of the interrupt program from the interrupt-program execution instructing unit, suspends the cyclic process and executes an interrupt program for reading the logging data from the log storage area in the first memory unit of the analog conversion device, and a second memory unit that stores therein the logging data read by the calculation unit.

4. The programmable controller system according to claim 3, wherein the calculation unit of the CPU uses the read-only parameters in the read-only parameter storage area to read the logging data for number of the logging readout number from a position indicated by the current logging readout pointer in the log storage area of the analog conversion device.

5. The programmable controller system according to claim 3, wherein the read-only parameters further includes a previous logging readout pointer, the previous logging readout pointer being a read position of logging data the last time an interrupt generation request was made, when the number of the logging data has reached the logging readout number, the fixed-number logging detection unit of the analog conversion device sets the current logging readout pointer stored in the read-only parameter storage area at that time as a new one of the previous logging readout pointer, and the fixed-number logging detection unit then writes, as a new one of the current logging readout pointer in the read-only parameter storage area, a position acquired by adding the logging readout number to the current logging readout pointer stored in the read-only parameter storage area at present, and upon reception of an execution instruction of the interrupt program from the interrupt-program execution instructing unit, the calculation unit of the CPU compares a position read last time in the log storage area of the analog conversion device with the previous logging readout pointer, and outputs a warning if the position does not match the previous logging readout pointer.

6. The programmable controller system according to claim 3, further comprising an information processing terminal having a third memory unit, wherein the CPU stores the logging data stored in the second memory unit in the third memory unit of the information processing terminal.

7. The programmable controller system according to claim 3, further comprising an external memory device, wherein the CPU stores the logging data stored in the second memory unit in the external memory device.

* * * * *